United States Patent
Cable et al.

(10) Patent No.: US 6,531,739 B2
(45) Date of Patent: Mar. 11, 2003

(54) RADIATION-HARDENED SILICON-ON-INSULATOR CMOS DEVICE, AND METHOD OF MAKING THE SAME

(75) Inventors: James S. Cable, San Diego, CA (US); Eugene F. Lyons, Santee, CA (US); Michael A. Stuber, Carlsbad, CA (US); Mark L. Burgener, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 09/828,289

(22) Filed: Apr. 5, 2001

(65) Prior Publication Data

US 2002/0171104 A1 Nov. 21, 2002

(51) Int. Cl.$^7$ ............................................. H01L 27/01
(52) U.S. Cl. .................. 257/347; 257/347; 257/348; 257/349; 257/350; 257/351; 257/352
(58) Field of Search ................. 257/347, 348, 257/349, 350, 351, 352, 353, 354, 355

(56) References Cited

U.S. PATENT DOCUMENTS

| | | | | |
|---|---|---|---|---|
| 5,026,656 A | * | 6/1991 | Matloubian et al. | 438/164 |
| 6,063,690 A | | 5/2000 | Woodruff et al. | 438/426 |
| 6,071,791 A | | 6/2000 | Hughes et al. | 438/423 |
| 6,268,630 B1 | * | 7/2001 | Schwank et al. | 257/347 |

* cited by examiner

Primary Examiner—David Nelms
Assistant Examiner—Mai-Huong Tran
(74) Attorney, Agent, or Firm—Morrison & Foerster LLP

(57) ABSTRACT

A method for eliminating the radiation-induced off-state current in the P-channel ultrathin silicon-on-sapphire transistor, by providing a retrograde dopant concentration profile that has the effect of moving the Fermi level at the back of the device away from that part of the bandgap where the interface states are located. When the Fermi level does not swing through this area in any region of operation of the device, subthreshold stretchout of the I-V curves does not occur.

6 Claims, 7 Drawing Sheets

RADIATION-HARDENED SILICON-ON-INSULATOR CMOS DEVICE, AND METHOD OF MAKING THE SAME

BACKGROUND OF THE INVENTION

1. Field of the Invention

This invention generally relates to semiconductor devices and processes and more specifically to a method of fabricating and processing P-channel transistors in silicon layers formed on insulating substrates to obtain devices having high degrees of total dose radiation hardness.

2. Description of Related Art

Metal oxide semiconductor (MOS) technology is virtually the standard for digital circuits used in computers and telecommunication devices today Increasingly, CMOS (complementary MOS) technology is utilized in these applications. CMOS technology incorporates both N-channel MOS and P-channel MOS transistors in the same monolithic structure.

"Radiation hardness" refers to the ability of a semiconductor device to withstand ionizing radiation without significant alteration of its electrical characteristics. A semiconductor device is said to be radiation hardened (rad-hard), radiation tolerant, or radiation resistant if it can continue to function within specifications after exposure to a specified amount and type of radiation. Semiconductor devices can be damaged or destroyed by the effects of ionizing radiation from natural and man-made sources. Radiation changes the electrical properties of solid state devices, leading to possible failure of any system incorporating them. Applications for radiation hardened semiconductor devices include use in harsh environments such as outer space, nuclear reactors, and particle accelerators. Additionally, improved radiation hardness is growing increasingly useful as semiconductor processing employs more processes that generate radiation. For example, processing techniques such as reactive ion etching and plasma etching introduce some radiation damage into the fabricated semiconductor structure.

The effect of ionizing radiation on MOS transistors is well known. The dominant effect is the charging of insulating layers adjacent to the semiconductor regions as a result of exposure to ionizing radiation. These charging effects have been widely studied, and mathematical models have been developed which provide a reasonable amount of predictive capability of the effect of ionizing radiation on the operation of an MOS device.

The induced charges can be categorized as one of two principal types, fixed oxide charges and interface state charges. The first type, fixed oxide charges, are incapable of exchanging charges with the semiconductor, and hence their charge density is insensitive to the position of the Fermi level in the adjacent semiconductor region. The second type is due to interface state charges which do exchange charges with the semiconductor layer and hence are sensitive to the position of the Fermi level in the adjacent semiconductor material. Both types of charges may or may not be produced in significant numbers as a result of the device being exposed to ionizing radiation. The two types of charges may occur separately or together.

There are several factors that determine the sensitivity of an MOS device to ionizing radiation exposure. Some of these factors include the dimensions of the device (W/L), the doping levels used in the construction of the device, the thicknesses of the insulating layers, and the electric fields across various regions of the device during the period of time that it is being exposed to the ionizing radiation environment.

In an effort to improve the performance of MOS devices, the art has focused on Semiconductor-On-Insulator (SOI) technology. In SOI technology, the devices are formed in a monocrystalline semiconductor layer, which is formed on an insulating layer which provides device isolation. While both conventional bulk CMOS devices and SOI CMOS devices may show degradation as a result of exposure to ionizing radiation, in SOI devices there are additional insulating layers (compared to bulk transistors) that can become charged as a result of radiation exposure.

It is well known that the so-called back interface of an SOI transistor can be very sensitive to ionizing radiation. In general, the charges that result are positive fixed charges in the back insulating layer. Since a positive oxide charge images a negative charge in the adjoining silicon region, the effect of such positive charge on the device operation can be readily understood.

In particular, for an N-channel transistor, the effect of such positive charge is to induce electrons at the back interface between the semiconductor layer and the insulating substrate. This will result in current flow between the source and drain of the transistor, even without the presence of a gate bias. This current is widely called "back channel" current to denote the fact that it is flowing near the back interface and is not capable of being controlled by the MOSFET gate. Similarly, it can be seen that positive charges in the back interface of a P-channel device will image negative charges in such a device, but that these negative charges will not result in any current flow in a P-channel transistor. Conversely, negative charges in such a back insulator image positive charges into the adjacent semiconductor region, causing current flow in a PMOS device, but no current flow in an NMOS device.

Previously, silicon-on-insulator (SOI) has been used for high performance microelectronics. The desirability of SOI devices for applications requiring radiation hardness is well-recognized. Fabrication of devices on an insulating substrate requires that an effective method for forming silicon CMOS devices on the insulating substrate be used. The advantages of using a composite substrate comprising a monocrystalline semiconductor layer, such as silicon, epitaxially deposited on a supporting insulating substrate, such as sapphire, have been well-recognized. These advantages include the substantial reduction of parasitic capacitance between charged active regions and the substrate and the effective elimination of leakage currents flowing between adjacent active devices. This is accomplished by employing as the substrate an insulating material, such as sapphire ($Al_2O_3$), spinel, or other known highly insulating materials, and providing that the conduction path of any interdevice leakage current must pass through the substrate.

An "ideal" silicon-on-insulator wafer may be defined to include a completely monocrystalline, defect-free silicon layer of sufficient thickness to accommodate the fabrication of active devices therein. The silicon layer would be adjacent to an insulating substrate and would have a minimum of crystal lattice discontinuities at the silicon-insulator interface. Early attempts to fabricate this "ideal" silicon-on-insulator wafer were frustrated by a number of significant problems, which can be summarized as (1) substantial incursion of contaminants into the epitaxially deposited silicon layer, especially the p-dopant aluminum, as a consequence of the high temperatures used in the initial epitaxial silicon deposition and the subsequent annealing of the silicon layer to reduce defects therein; and (2) poor crystalline quality of the epitaxial silicon layers when the problematic high temperatures were avoided or worked around through various implanting, annealing, and/or regrowth schemes.

It has been found that these high quality silicon films suitable for demanding device applications can be fabricated on insulating substrates by a method that involves epitaxial deposition of a thin silicon layer on an insulating substrate, low temperature ion implant to form a buried amorphous region in the silicon layer, and annealing the composite at temperatures below about 950° C. Sapphire is a very suitable and advantageous insulating substrate; though other oxide materials such as spinel may be employed. Examples of and methods for making such silicon-on-sapphire devices are described in U.S. Pat. No. 5,416,043 ("Minimum charge FET fabricated on an ultrathin silicon on sapphire wafer"); U.S. Pat. No. 5,492,857 ("High-frequency wireless communication system on a single ultrathin silicon on sapphire chip"); U.S. Pat. No. 5,572,040 ("High-frequency wireless communication system on a single ultrathin silicon on sapphire chip"); U.S. Pat. No. 5,596,205 ("High-frequency wireless communication system on a single ultrathin silicon on sapphire chip"); U.S. Pat. No. 5,600,169 ("Minimum charge FET fabricated on an ultrathin silicon on sapphire wafer"); U.S. Pat. No. 5,663,570 ("High-frequency wireless communication system on a single ultrathin silicon on sapphire chip"); U.S. Pat. No. 5,861,336 ("High-frequency wireless communication system on a single ultrathin silicon on sapphire chip"); U.S. Pat. No. 5,863,823 ("Self-aligned edge control in silicon on insulator"); U.S. Pat. No. 5,883,396 ("High-frequency wireless communication system on a single ultrathin silicon on sapphire chip"); U.S. Pat. No. 5,895,957 ("Minimum charge FET fabricated on an ultrathin silicon on sapphire wafer"); U.S. Pat. No. 5,920,233. ("Phase locked loop including a sampling circuit for reducing spurious side bands"); U.S. Pat. No. 5,930,638 ("Method of making a low parasitic resistor on ultrathin silicon on insulator"); U.S. Pat. No. 5,973,363 ("CMOS circuitry with shortened P-channel length on ultrathin silicon on insulator"); U.S. Pat. No. 5,973,382 ("Capacitor on ultrathin semiconductor on insulator"); and U.S. Pat. No. 6,057,555 ("High-frequency wireless communication system on a single ultrathin silicon on sapphire chip").

By the methods described in the patents listed above, electronic devices can be formed in an extremely thin layer of silicon on an insulating substrate such as an insulating synthetic sapphire wafer. The thickness of the silicon layer is typically less than 150 nm. Such an "ultrathin" silicon layer maximizes the advantages of the insulating sapphire substrate and allows the integration of multiple functions on a single chip. In these devices, referred to herein as "ultrathin silicon-on-sapphire" devices, traditional transistor isolation wells required for thick silicon are unnecessary, simplifying transistor processing and increasing circuit density.

CMOS circuits have been fabricated on ultrathin silicon-on-sapphire substrates prepared by the methods described in the aforementioned patents. Such ultrathin silicon-on-sapphire CMOS circuitry possesses very high speed and low power consumption characteristics. While the ultrathin silicon-on-sapphire technology may be implemented in many well-known silicon circuit designs and devices, further innovative and advantageous circuit designs are possible that are enabled by the distinctive electrical and materials properties of the sapphire substrate.

Normally, radiation-induced charges in insulating layers are charged positively. This effect occurs because as most insulators are ionized by the radiation, the electron mobility in these layers is sufficiently high so that the created electrons are able to be swept out of the insulating layers by the electric fields which are present, leaving behind a net positive charge. It is thus generally true that the N-channel device is much more sensitive to ionizing radiation than the P-channel device. There have been a wide variety of approaches developed to "harden" NMOS transistors from these detrimental effects.

In an ultrathin silicon-on-sapphire transistor, the back insulator is sapphire as opposed to $SiO_2$. The charging that occurs as a result of exposure to ionizing radiation is dramatically different from that observed in other forms of SOI technology. Under a certain set of bias conditions, exposure to ionizing radiation creates interface states at the sapphire/Si interface. These interface states are acceptor states (they are charged negatively when they are located below the Fermi level and neutral when they are above the Fermi level). The acceptor states are all located below midgap.

The effects of these below-midgap, radiation-induced acceptor states on the I-V characteristics of PMOS and NMOS ultrathin silicon-on-sapphire transistors are shown in FIGS. 1–4. FIG. 1 shows the energy band diagram 1 of a P-channel ultrathin silicon-on-sapphire transistor (electron energy vs. distance from surface) following exposure to radiation and the creation of the interface states 8. Region 2 is dielectric, region 3 is the silicon layer in the channel region, and region 4 is the insulator (the insulating sapphire substrate). FIG. 1 represents the case where the gate voltage is at the threshold voltage of the device. Curve 5 represents the conduction band edge, curve 6 represents the valence band edge, and curve 7 depicts the Fermi energy. It can be observed that at the back interface, the Fermi energy level is located in the region where the acceptor states are. Hence, as the device is swept below threshold, these acceptor states change charge as the Fermi level sweeps through them. This charging results in an I-V curve as shown in FIG. 2, an I-V curve for the P-channel transistor of FIG. 1, before (curve 10) and after (curve 9) exposure to radiation and the creation of interface states. Note that the curve 9 (the off state leakage current) is "stretched out" with respect to its pre-irradiated characteristics. Note also that the off state leakage (that current which flows with the gate at zero volts) increases dramatically after irradiation (curve 9). This effect represents a serious performance degradation for a MOS device; under normal conditions, MOS transistors are capable of offering a $10^9:1$ ratio of on-state to off-state current.

By contrast, FIGS. 3 and 4 show the effect of these acceptor states on the I-V characteristics of a N-channel transistor. FIG. 3 shows the energy band diagram 11 of an N-channel transistor following exposure to radiation and the creation of interface states 8, where the gate voltage is at the threshold voltage of the device. Curve 13 represents the conduction band edge, curve 14 represents the valence band edge, and curve 15 depicts the Fermi energy. FIG. 4 shows the I-V curve for the N-channel transistor of FIG. 3, before (curve 16) and after (curve 17) exposure to radiation and the creation of interface states. At threshold, the Fermi level is above all of the states, and all of the acceptor states are occupied. As the gate voltage sweeps the device below threshold, the Fermi level does not move through the region of the bandgap where the states are located. Hence (as shown in FIG. 4) the net effect of the radiation-induced interface states on the N-channel transistor is only to cause a threshold shift 18 due to the fixed charge in these states and very little deleterious effect on the off-state leakage current.

The need to reduce off-state current in silicon-on-insulator devices in radiation exposed environments has been recognized, and some attempts to improve the situation have been reported.

U.S. Pat. Nos. 5,391,901 and 5,298,434 ("Selective recrystallization to reduce P-channel transistor leakage in silicon-on-sapphire CMOS radiation-hardened circuits") describe "traditional" silicon-on-sapphire (SOS) P-channel devices. In contrast to the ultrathin silicon-on-sapphire structures described above which are of high crystalline quality, these earlier SOS devices have relatively high defect levels in the silicon overlayers, a result of the lattice mismatch between the silicon and the insulating substrate. U.S. Pat. Nos. 5,391,901 and 5,298,434 are directed to methods for balancing leakage currents in N-channel and P-channel devices by controlling the concentrations of these relatively high defect densities.

U.S. Pat. No. 4,633,289 ("Latch-up immune, multiple retrograde well high density CMOS FET") and U.S. Pat. No. 5,428,239 ("Semiconductor device having retrograde well and diffusion-type well") describe ion-implanted CMOS devices fabricated in bulk silicon, having a "retrograde" dopant concentration profile in the well region.

U.S. Pat. No. 4,054,895 ("Silicon-on-sapphire mesa transistor having doped edges") describes silicon-on-sapphire transistors with channel edge regions (adjacent to the source regions) which are selectively doped with a high concentration of active carriers to raise the threshold voltage at the channel edge regions, thereby providing a higher breakdown voltage between the channel regions at the edge and the drain regions.

U.S. Pat. No. 5,360,752 ("Method to radiation harden the buried oxide in silicon-on-insulator structures") describes a method to radiation harden silicon-on-insulator structures by implanting recombination-center-generating dopants into the buried oxide layer. In contrast to the high crystalline quality ultrathin silicon-on-sapphire structures described above, these SOS structures are formed by bonding and annealing a silicon device wafer to a thick oxide layer formed by wet oxidation of a first silicon substrate.

U.S. Pat. No. 3,882,350 ("Radiation hardening of MOS devices by boron") describes radiation hardening of N-channel MOS devices by implanting a high dose of boron ions into the oxide region.

U.S. Pat. No. 5,220,192 ("Radiation-hardened CMOS structure using an implanted P guard structure and method for the manufacture thereof"); U.S. Pat. No. 4,797,721 ("Radiation hardened semiconductor device and method of making the same"); and U.S. Pat. No. 4,591,890 ("Radiation hard MOS devices. and methods for the manufacture thereof") describe approaches for radiation-hardening N-channel devices.

While significant progress has been made in producing radiation-hardened MOS devices, these prior art techniques do not recognize or address the effects of the charging that occurs as a result of exposure to ionizing radiation, in the silicon-insulator interface region of the NMOS transistor formed in ultrathin silicon-on-sapphire. Consequently, in order to take advantage of the desirable properties of ultrathin silicon-on-sapphire devices in radiation exposed environments, there is a need for an efficient method for eliminating or greatly reducing the radiation-induced off-state current in P-channel ultrathin silicon-on-sapphire transistors, and for forming silicon-on-sapphire devices that have reduced off-state current after irradiation.

SUMMARY OF THE INVENTION

The present invention addresses the limitations and shortcomings previously described by providing a fabrication process that creates a retrograde dopant concentration profile in the channel region of a PMOS transistor sufficient to move the Fermi level at the back of the device away from the acceptor states that are formed as a result of ionizing radiation. The invention thus provides a method for eliminating or greatly reducing the radiation-induced off-state current in the P-channel ultrathin silicon-on-sapphire transistor, by providing a doping method that has the effect of moving the Fermi level at the back of the device away from that part of the bandgap where the interface states are located. When the Fermi level does not swing through this area in any region of operation of the device, subthreshold stretchout of the I-V curves does not occur.

The invention therefore provides enhanced radiation hardness to P-channel transistors formed in an ultrathin silicon-on-sapphire substrate. In one embodiment of the invention, PMOS transistors and NMOS transistors are fabricated together in the same substrate, providing radiation-hardened CMOS devices that have the performance advantages enabled by the ultrathin silicon-on-sapphire substrate. Applications for the radiation-hardened CMOS devices of the invention include fabrication and use in various radiation-rich environments.

Thus, the present invention provides a silicon-on-insulator metal oxide semiconductor device which is more resistant to performance degradation caused by exposure to ionizing radiation. In one embodiment, the radiation-hardened MOS device includes: an ultrathin silicon-on-sapphire substrate; and at least one P-channel MOS transistor fabricated in the ultrathin silicon layer, wherein the ultrathin silicon layer in the P-channel region of the transistor is characterized by a retrograde N-type dopant concentration profile.

In these radiation-hardened MOS devices, the retrograde N-type dopant concentration is at least twice as high near the silicon-insulator interface as near the top of the silicon layer where it meets the dielectric layer. Preferably, the retrograde N-type dopant concentration is at least ten times as high near the silicon-insulator interface as near the top of the silicon layer. In preferred embodiments, the N-type dopant is typically selected from phosphorus, arsenic and antimony.

The step of forming the retrograde N-type dopant concentration profile may be incorporated into standard process flows allowing complex, radiation-hard CMOS. circuits to be produced. The step of forming the retrograde N-type dopant concentration profile does not interfere with subsequent processing steps such as metallization, contact formation, formation of resistors and capacitors, and so forth.

Another embodiment of the invention provides a method for making silicon-on-insulator metal oxide semiconductor devices which are radiation hardened. The method includes: providing an ultrathin silicon-on-sapphire substrate; forming a retrograde N-type dopant concentration profile in a region of the ultrathin silicon layer; and forming a P-channel MOS transistor in the ultrathin silicon layer, wherein at least a portion of the N-type retrograde dopant concentration region forms the P-channel region of the P-channel MOS transistor. The retrograde N-type dopant concentration profile may be produced by any suitable methods such as ion implantation or epitaxy.

In another embodiment of the invention, ion implantation at relatively high energies is employed to form a deep retrograde dopant concentration profile in the channel region of the PMOS transistor. The retrograde ion implant method includes: providing an ultrathin silicon-on-sapphire substrate; performing a deep N-type retrograde ion implant in a region of the ultrathin silicon layer; and forming a P-channel MOS transistor in the ultrathin silicon layer, wherein at least a portion of the deep N-type retrograde ion implanted region forms the P-channel region of the P-channel MOS transistor. In preferred embodiments, the ion implant is performed at an implant energy in the range of approximately 100 to 200 Kev.

Because P-channel MOS transistors, formed as described above, may be fabricated in a common substrate with N-channel MOS transistors, the invention provides a method of fabricating CMOS devices on an ultrathin silicon-on-sapphire wafer to give rise to radiation hardened CMOS circuitry of wide utility.

DETAILED DESCRIPTION OF THE INVENTION, AND PREFERRED EMBODIMENTS THEREOF

Figure 1:
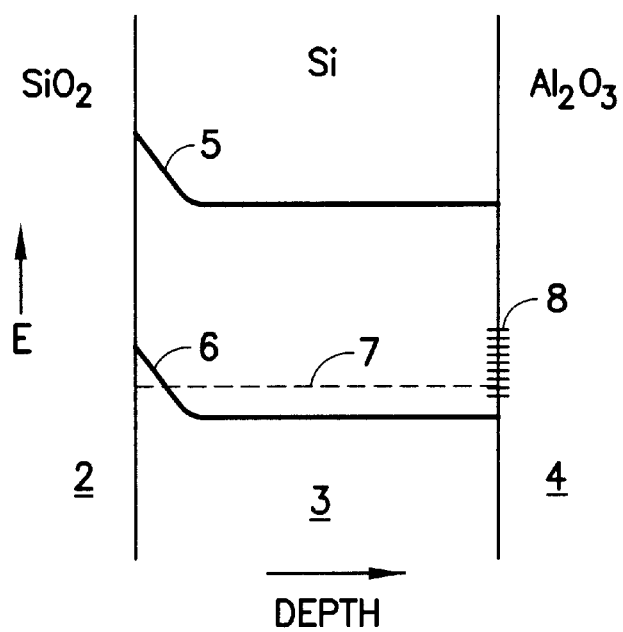
FIG. 1 illustrates an energy band diagram of a P-channel transistor formed in ultrathin silicon-on-sapphire, following exposure to radiation and the creation of interface states, where the gate voltage is at the threshold voltage of the device.
Figure 2:
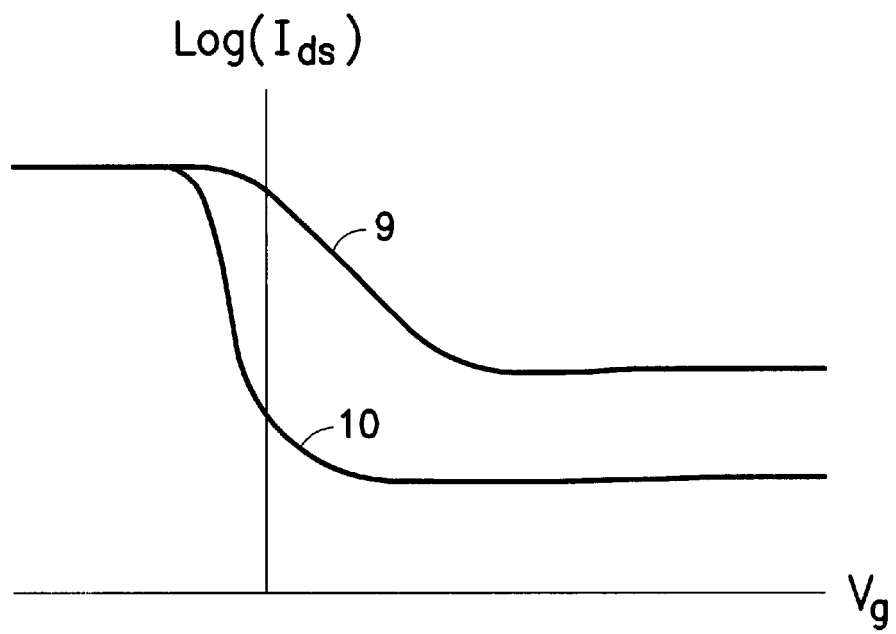
FIG. 2 shows I-V curves for the P-channel transistor of FIG. 1, before and after exposure to radiation and the creation of interface states.
Figure 3:
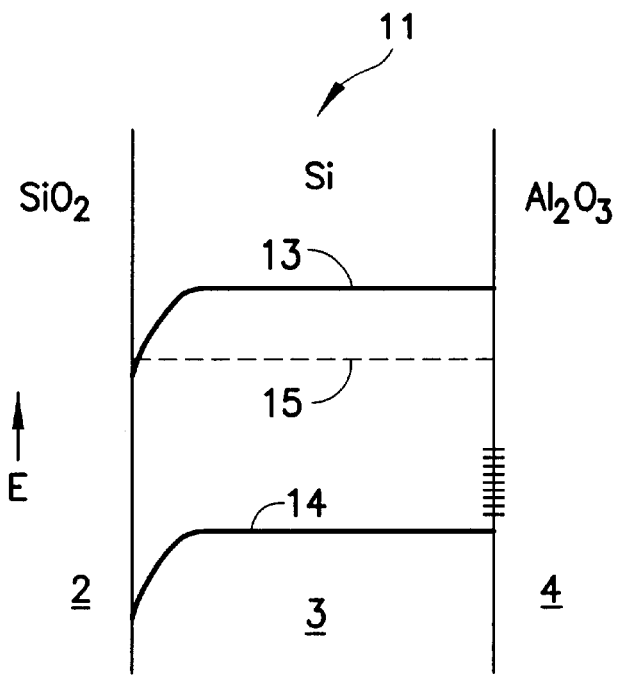
FIG. 3 shows an energy band diagram of an N-channel transistor formed in ultrathin silicon-on-sapphire, following exposure to radiation and the creation of interface states, where the gate voltage is at the threshold voltage of the device.
Figure 4:
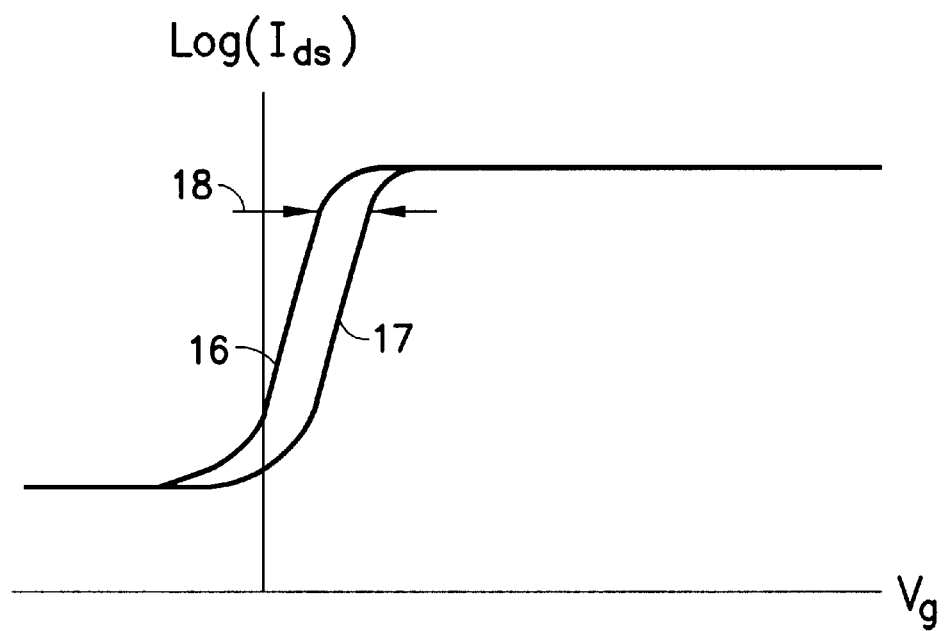
FIG. 4 shows I-V curves for the N-channel transistor of FIG. 3, before and after exposure to radiation and the creation of interface states.

The invention is described in detail below with reference to the figures wherein like reference numerals refer to like elements or regions throughout. The P-channel MOS devices are formed in ultrathin silicon-on-sapphire wafers, prepared by methods disclosed in, for example, U.S. Pat. Nos. 5,416,04; 5,492,857; 5,572,040; 5,596,205; 5,600,169; 5,663,570; 5,861,336; 5,863,823; 5,883,396; 5,895,957; 5,920,233; 5,930,638; 5,973,363; 5,973,382; and 6,057,555.

To accomplish an effective radiation-hardening retrograde doping profile, the dopant concentration in the channel region can be controlled by well-known methods, e.g. ion implantation or epitaxy. Formation (by both ion implantation and epitaxy) and properties of semiconductors with retrograde doping profiles are discussed, for example, by Wolf (*Silicon Processing for the VLSI Era. Volume 3: The Submicron MOSFET.* Wolf, S.; Lattice Press, Sunset Beach, Calif., 1995; pages 539–555).

As used herein, the terms "retrograde doping profile" and "retrograde dopant concentration profile" indicate that the dopant concentration at or near the "bottom" of the silicon layer, i.e. the silicon-insulator interface, is higher than the dopant concentration at or near the "top" of the silicon layer, i.e. at the interface between the silicon layer and the overlying dielectric. A desirable retrograde doping profile in the silicon layer in the P-channel region of the finished device has dopant concentration at least twice as high near (e.g., in the volume of the silicon layer within 10 nm of) the silicon-insulator interface as the dopant concentration near (e.g., in the volume of the silicon layer within 10 nm of) the top of the silicon layer. In one embodiment, the dopant concentration near the silicon-insulator interface is preferably at least 10 times as high as the dopant concentration near the silicon surface.

In one embodiment of the invention, a deep retrograde N-type ion implant into the channel region of the PMOS FET is performed. The terms "retrograde implant" or "retrograde ion implant," as used herein, mean an ion implant step that is performed at dosage and energy conditions, using a suitable doping species, such that even after subsequent device fabrication steps occur, the dopant concentration at or near the silicon-insulator interface is higher than the dopant concentration at or near the silicon surface. A desirable retrograde implant will result in the silicon layer in the P-channel of the finished device having a dopant concentration at least twice as high near (e.g.., in the volume of the silicon layer within 10 nm of) the silicon-insulator interface as the dopant concentration near (e.g., in the volume of the silicon layer within 10 nm of) the top of the silicon surface. In a preferred embodiment, the dopant concentration near the silicon-insulator interface is preferably at least 10 times as high as the dopant concentration near the silicon surface.

The deep N-type retrograde implant is performed by well-known methods to create a spike of dopant concentration at the interface between the insulating sapphire substrate and the semiconductor layer. Subsequent thermal steps required to form the MOS device have the effect of spreading this dopant concentration peak to some extent. Ideally, the dopant concentration will steeply increase with depth in the ultrathin silicon layer, becoming highest near the silicon-insulator interface.

Figure 5:
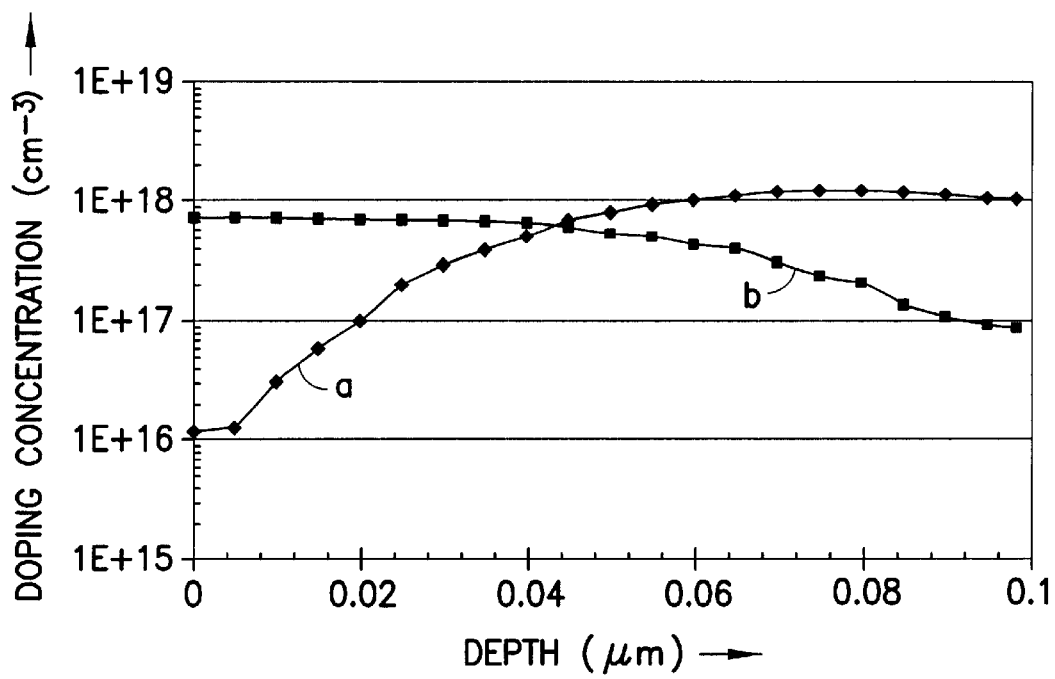
FIG. 5 illustrates two doping profiles for ion implants into the channel region of a PMOS FET formed in ultrathin silicon-on-sapphire: (a) implanted using a retrograde implant method in accordance with one embodiment of the present invention; and (b) implanted with the same dosage in a standard, non-retrograde method.

It is understood that the figures are generally illustrative and are not necessarily shown in exact scale or proportion. FIG. 5 shows a dopant concentration profile simulated for a deep retrograde in accordance with one embodiment of the invention, in comparison to a standard concentration profile for N-type ion implants into the channel region of a PMOS transistor formed in ultrathin silicon-on-sapphire. Curve (a) shows a profile implanted according to the retrograde implant method of the present invention. Curve (b) is a profile for a device whose channel region was implanted with the same dosage in a standard, non-retrograde method. In this example, the silicon layer was approximately 100 nm thick. Curve (b) was obtained by implanting phosphorus ($5\times10^{12}$ cm$^{-2}$) at an energy of 35 Kev. By contrast, the retrograde profile of curve (a) was obtained by implanting arsenic ($5\times10^{12}$ cm$^{-2}$) at 160 Kev. It can be seen that the higher energy implant of curve (a) leads to a significantly higher dopant concentration in the volume of the ultrathin silicon layer as the depth of the implant increases toward the bottom of the silicon layer where it meets the sapphire insulator.

An ideal retrograde implant doping profile places a dopant concentration spike at or close to the back interface, with a sharp transition to a much lower doped region nearer the surface. Such an ideal retrograde implant profile is difficult to realize in practice because of diffusion, but proper selection of dopant species, implant doses and energies, and post-implant anneal processes (times and temperatures) allows the practitioner to achieve suitable dopant profiles as close to the ideal structure as possible. For example, the use of Rapid Thermal Annealing (RTA) minimizes dopant redistribution, maintaining the retrograde nature of the profile. In addition, use of slower-diffusing N-type dopant species such as arsenic and antimony will result in a stronger retrograde profile.

Advantageously, the thinness of the active silicon layer in the ultrathin silicon-on-sapphire structures allows the creation of retrograde dopant profiles by ion implantation to be accomplished at relatively low implantation energies. Energies below about 200 Kev are useful for the implantation of effective radiation-hardening dopant profiles. Ion implanters in this energy range are readily available and known to practitioners. In general, energies in the range of 100–200 Kev are suitable.

For example, arsenic implant doses in the range of $5\times10^{12}$ cm$^{-2}$ to $1.2\times10^{13}$ cm$^{-2}$ at energies of 160 Kev into 100 nm silicon films through a 10 nm screen oxide were found to dramatically improve the back interface state off leakage current in a P-channel transistor fabricated on a composite ultrathin silicon-on-sapphire substrate.

In the practice of the invention, the doping dosages and energies selected will depend on the PMOS device dimensions, in particular the thickness of the ultrathin silicon layer within which the transistor is made, and other device parameters, and can be determined by practitioners without undue experimentation. For typical PMOS devices formed in an ultrathin silicon layer whose thickness is typically less than 150 nm, retrograde doping will typically be performed at levels of $10^{12}$ cm$^{-2}$ to $5\times10^{13}$ cm$^{-2}$, at implant energies sufficient to form a dopant concentration spike near the interface. N-Type dopant elements useful in the practice of the invention include any N-type dopants that are acceptable in the finished device, such as phosphorus, arsenic and antimony. Because it is desirable to minimize diffusion of the dopant concentration spike during subsequent thermal steps, arsenic and antimony are especially useful.

Figure 6:
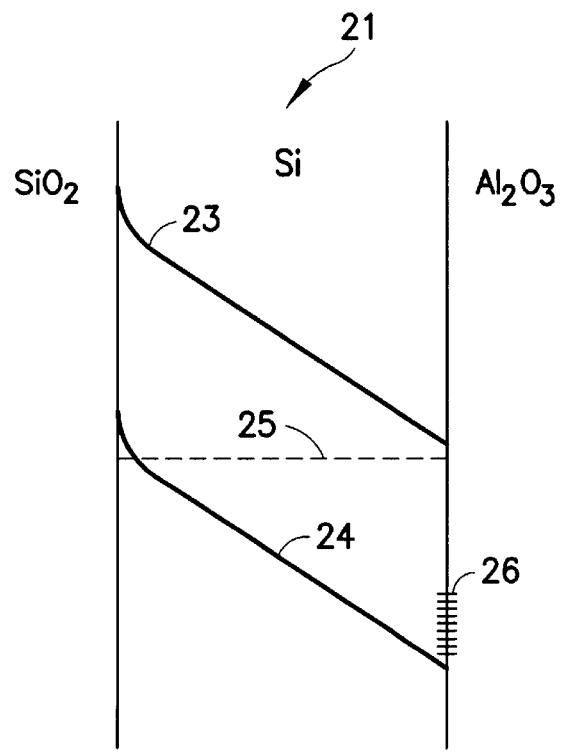
FIG. 6 shows an energy band diagram of a PMOS transistor formed in a ultrathin silicon-on-sapphire substrate and implanted using a retrograde implant method in accordance with one embodiment of the present invention, following exposure to radiation and the creation of interface states, where the gate voltage is at the threshold voltage of the device.
Figure 7:
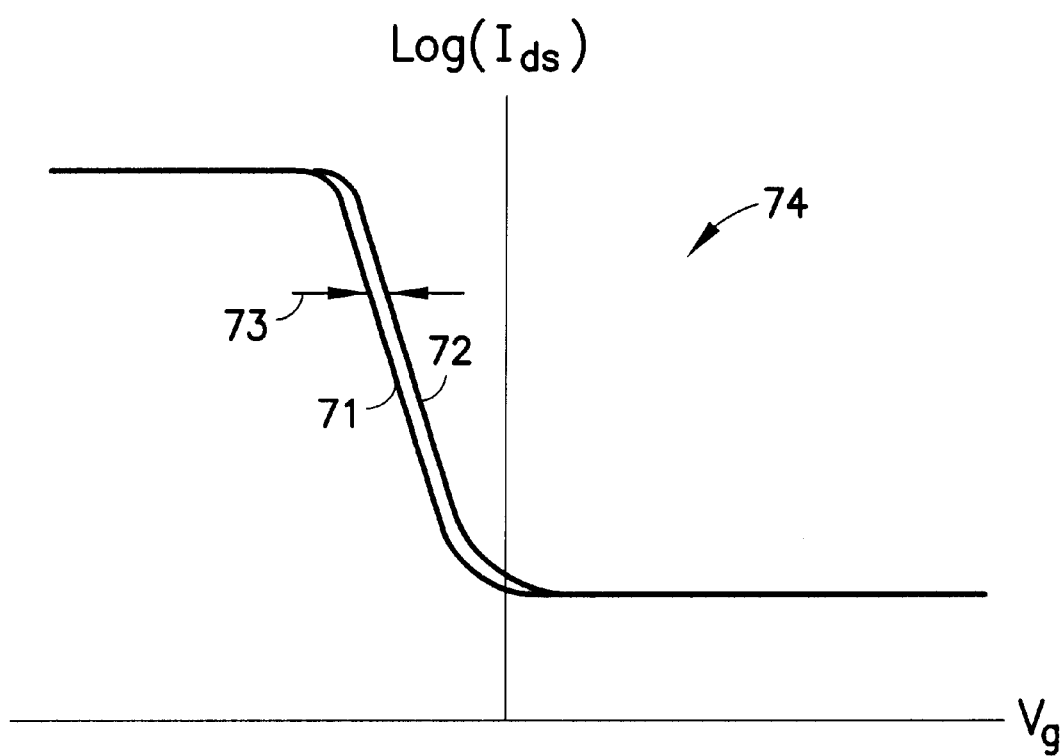
FIG. 7 shows the I-V curves for the PMOS transistor of FIG. 6, before and after exposure to radiation and the creation of interface states.

The retrograde implant profile in an exemplary ultrathin silicon-on-sapphire PMOS device, as shown in FIG. 5(a), results in a built-in vertical electric field in the MOS transistor, which causes the band diagram at threshold to be as shown schematically in FIG. 6. In FIG. 6, the band diagram of the P-channel transistor of FIG. 5(a) is depicted following exposure to radiation and the creation of interface states, where the gate voltage is at the threshold voltage of the device. Curve 23 represents the conduction band edge, curve 24 represents the valence band edge, and curve 25 depicts the Fermi energy. The primary result of the retrograde doping is that the Fermi level at the back of the silicon layer has been moved far away from the acceptor states that are formed as a result of ionization radiation. Any such states that are created are well below the Fermi level at all bias conditions of the device. These states are thus always occupied (charged negatively), hence ionizing radiation results only in a fixed threshold voltage shift as illustrated in FIG. 7, which shows the I-V characteristics 74 for the P-channel transistor of FIG. 5(a), before (curve 71) and after (curve 72) exposure to radiation and the creation of interface states. No stretch-out of the I-V curves results, and no off state leakage is measured on the PMOS device as a result of the radiation. Only a very slight offset (73) may result from radiation exposure.

Using the retrograde implant method of the invention for P-channels allows complex, radiation-hard CMOS circuitry to be fabricated that can take advantage of the advantageous properties of the ultrathin silicon-on-sapphire substrate, such as the substantial reduction of parasitic capacitance between charged active regions and the substrate and the effective elimination of leakage currents flowing between adjacent active devices. Furthermore, integration of silicon and opto-electronic devices on a common insulating transparent substrate is possible—sapphire is transparent to a very wide range of optical wavelengths and possesses excellent optical homogeneity; its coefficient of thermal expansion closely matches that of GaAs; and it is an excellent electrical insulator and thermal conductor. While GaAs devices are typically already radiation-hard, the invention provides the ability to make controlling silicon CMOS circuitry more radiation hardened as well.

An example of the design and fabrication of active CMOS devices that employ the retrograde implant process to gain improved radiation-hardness is described with reference to FIG. 8. Many modifications to this example will be readily apparent to those skilled in the art. The formation of a retrograde N-type dopant concentration profile in the P-channel region of the PMOS transistor involves steps that are applicable to other devices that are contemplated to be within the spirit and scope of the invention.

In one embodiment, MOSFET processing steps are limited to temperatures less than approximately 950° C. in order to minimize impurity diffusion into the silicon N-channel regions. Additionally, anneals performed in non-oxidizing conditions are performed at temperatures less than approximately 950° C. Unless otherwise stated, it will be understood throughout that there may be other standard semiconductor processing steps which will achieve the same or functionally similar results as described below. Substitution of these alternatives are considered to be within the scope of the present invention.

In one MOSFET embodiment, formation of isolated N-type and P-type regions in the silicon layer 28 is accomplished using a process often referred to as "local oxidation of silicon" (LOCOS). Alternatively, instead of using the LOCOS process to form the isolated N-type and P-type regions, other isolation techniques may be employed. One such alternative process etches the silicon layer 28 into individual islands (sometimes called "mesas"), to form the isolated N-type and P-type regions. Additional alternative processing procedures are known in the art and disclosed in, for example, "VLSI Technology", Second Edition, edited by S. M. Sze, published by McGraw-Hill, New York, 1988.

Figure 8A:
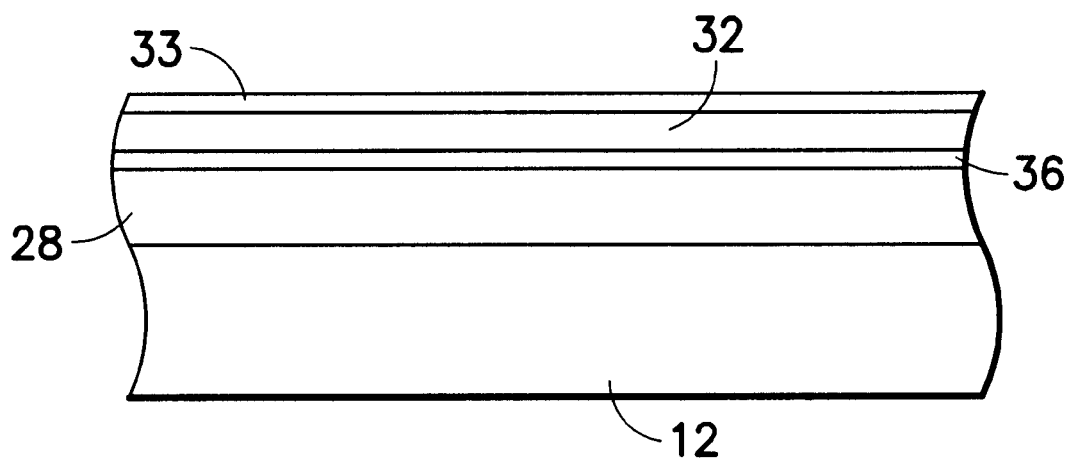
FIGS. 8A–8D illustrate process steps for forming a radiation-hardened PMOS transistor in ultrathin silicon-on-sapphire, in accordance with one embodiment of the invention.
Figure 8B:
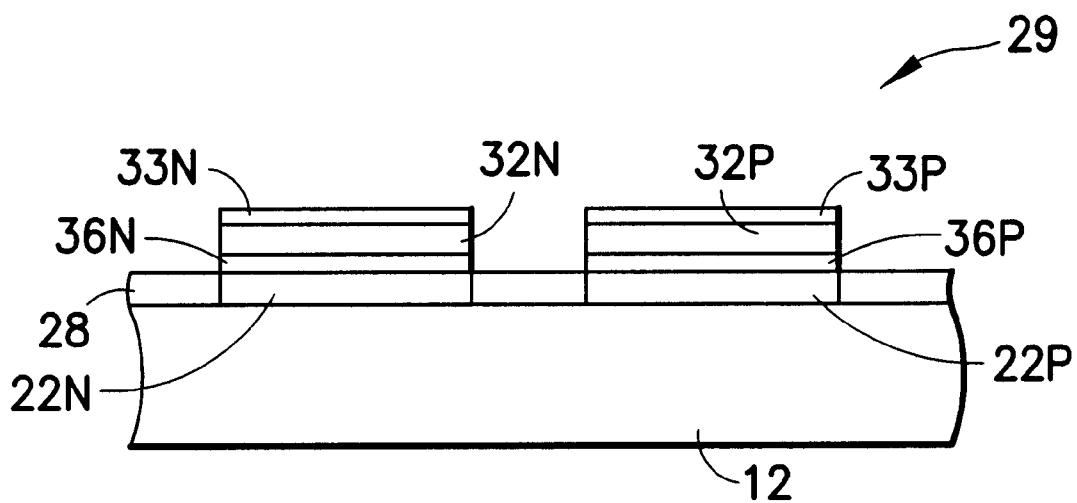

As shown in FIG. 8A, formation of isolated N-type and P-type regions with the LOCOS process begins with the deposition of a silicon dioxide layer 36, a silicon nitride layer 32, and a photoresist layer 33 on top of the silicon layer 28 on the sapphire substrate 12. FIG. 8B. shows individual islands (36P, 32P, 33P) and (36N, 32N, 33N) of the silicon dioxide layer 36, silicon nitride layer 32 and photoresist layer 33 formed on the surface of the silicon layer 28 using standard masking and etching processes.

Figure 8C:
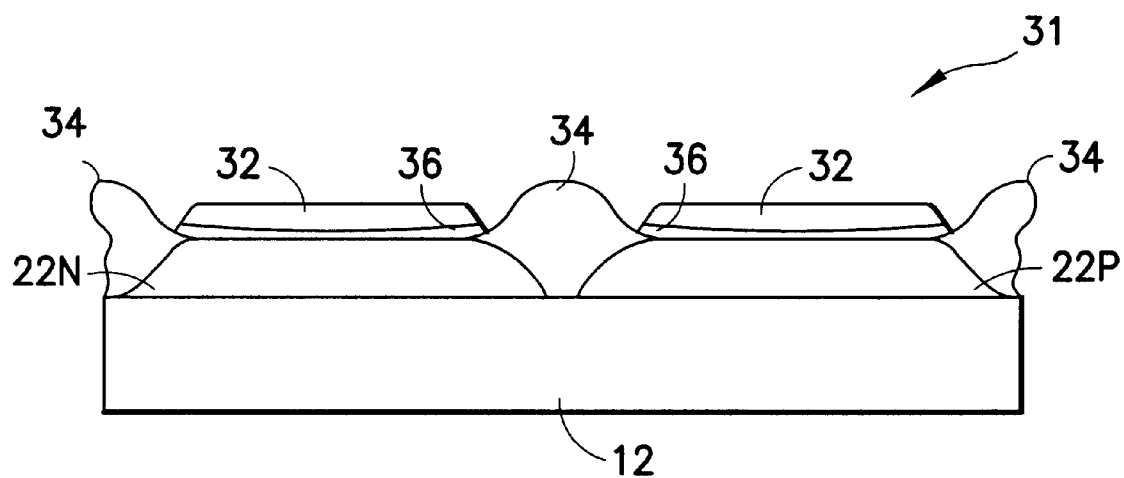

Standard masking techniques are employed, and ion implantation techniques are used to form a silicon N-type region 22N and a silicon P-type region 22P as shown in FIG. 8C. For example, the silicon P-type region 22P is formed by ion implantation of the silicon layer 28 underlying the island (36P, 32P, 33P) with boron. The silicon N-type region 22N is formed by ion implantation of the silicon layer 28 underlying the island (36N, 32N, 33N) with arsenic (dose $5 \times 10^{12}$ $cm^{-2}$ to $1.4 \times 10^{13}$ $cm^{-2}$). In accordance with the invention, the N-type region is implanted at an energy (e.g., approximately 160 kev) sufficient to place the dopant peak concentration at a depth near the silicon/insulator interface. In a preferred embodiment, this peak concentration occurs within ten nanometers (nm) of the silicon-insulator interface. It is understood, however, that the peak concentration may occur at different distances from the silicon-sapphire interface depending on the device dimensions and desired performance characteristics. These embodiments are contemplated to be within the scope of the invention.

As shown in FIG. 8C, the silicon N-type region 22N is isolated from the silicon P-type region 22P by the growth of a silicon dioxide region 34. The silicon dioxide regions 34 are grown by introducing the wafer 29 shown in FIG. 8B into a high temperature (less than approximately 950° C.) oxidizing ambient environment. The silicon dioxide isolation regions 34 extend down to the sapphire substrate 12. Although the wafer 29 is in an oxidizing ambient, the silicon nitride layer 32 shields the silicon regions 22N and 22P, thereby keeping those regions from oxidizing. After growing the isolation regions 34, the silicon nitride layer 32 and the stress relief oxide layer 36 are stripped away.

FIG. 8C shows regions 22N and 22P fully isolated from each other by the silicon dioxide isolation regions 34 for complementary MOS transistors. Alternative isolation techniques may also be employed. For example, the silicon layer 28 may be etched into individual islands (sometimes called "mesas"). Thus, upon removal of the silicon dioxide regions 34 by etching, the silicon islands 22N and 22P become individual isolated islands or mesas.

Figure 8D:
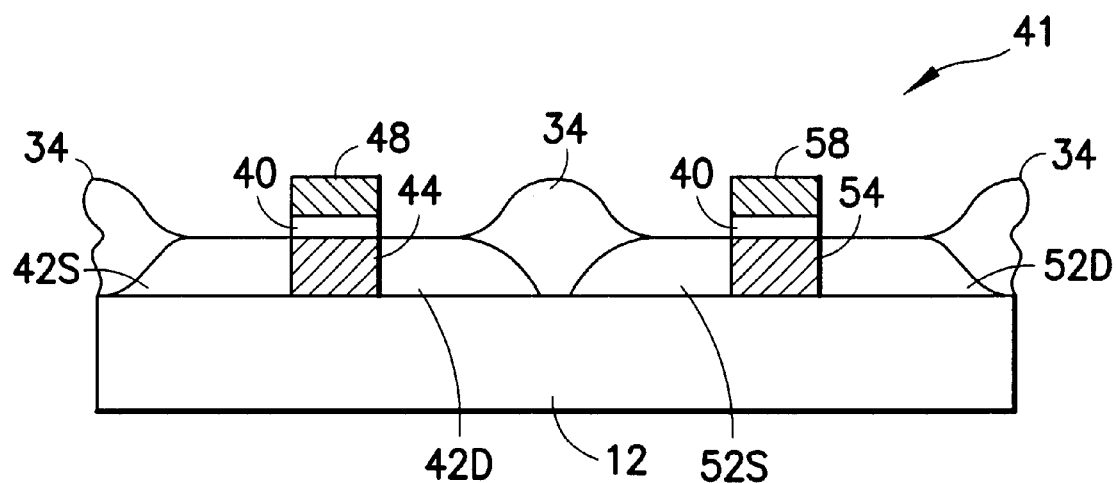

A subsequent stage 41 of the MOSFET process is shown in FIG. 8D. In stage 41, the N-type and P-type regions 22N and 22P (FIG. 8C) are further processed to form self aligned sources 42S and 52S, conduction regions 44 and 54, and self aligned drains 42D and 52D, respectively. Additionally, gate insulators 40 and gate conductive layers 48 and 58 form a control gate structure. The control gate structure is formed by thermal oxidation of the gate insulators 40 followed by deposition and patterning of a chosen gate conductive layer 48 for the P-channel and conductive layer 58 for the N-channel.

Threshold voltage of the control gate structure is initially determined by correctly choosing the gate conductor material according to its so-called "metal work function." Adjustments to the threshold voltage are made when dopants are introduced into the conduction channels, that is in the ion implant steps described above for forming the silicon N-type region 22N and the silicon P-type region 22P. In accordance with one embodiment of the present invention, no dopant atoms other than those introduced for threshold adjustment are included in the conduction channel regions 44 and 54. The absence or low concentrations of dopants in the MOSFET embodiments of the present invention represents an improvement over traditional MOSFET designs wherein substantial concentrations of dopant atoms are typically present for various reasons (e.g., as integral parts of traditional transistors; to provide isolation; as a byproduct of counterdoping; etc.). By fabricating MOSFETs in substantially pure silicon on sapphire in accordance with the present invention, only minimal concentrations of dopant atoms are present, thereby significantly reducing parasitic charge and its associated degradations.

Because the retrograde implant step takes place during the P-channel threshold adjustment step, it does not interfere with any other CMOS steps that may occur before or after, for example: edge control implants, implant of the source and drain regions, formation of lightly doped drain regions, doping of the polysilicon gate 48, formation of resistors, formation of MIM capacitors. Subsequent metallization and contact formation steps are all done in the standard ways and are not impacted by the radiation-hardening step. Thus the method of the invention may be included in normal process flows to produce diverse CMOS circuitry, with significantly enhanced radiation hardness.

It is also possible to achieve the desirable "spike" dopant profile through a variety of processing conditions known to practitioners. Alternatives approaches involve pre-amorphization implants, heavier implant species, and/or modified rapid thermal annealing conditions. Phosphorus or antimony implants as well as arsenic are possible.

Figure 9A:
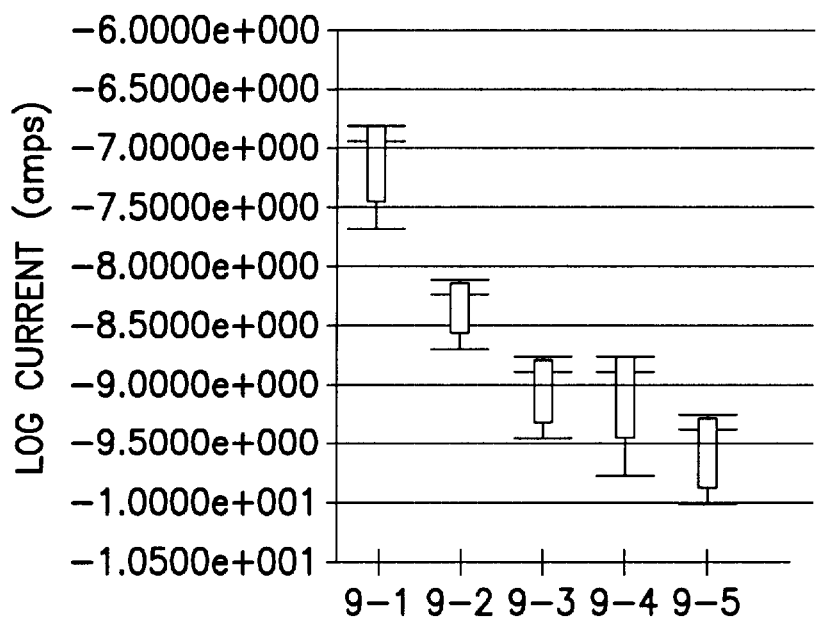
FIGS. 9A and 9B show comparative leakage currents and threshold voltages, respectively, for PMOS transistors formed in ultrathin silicon-on-sapphire, for varying ion implant dosages having both standard and retrograde profiles, after exposure to ionizing radiation.
Figure 9B:
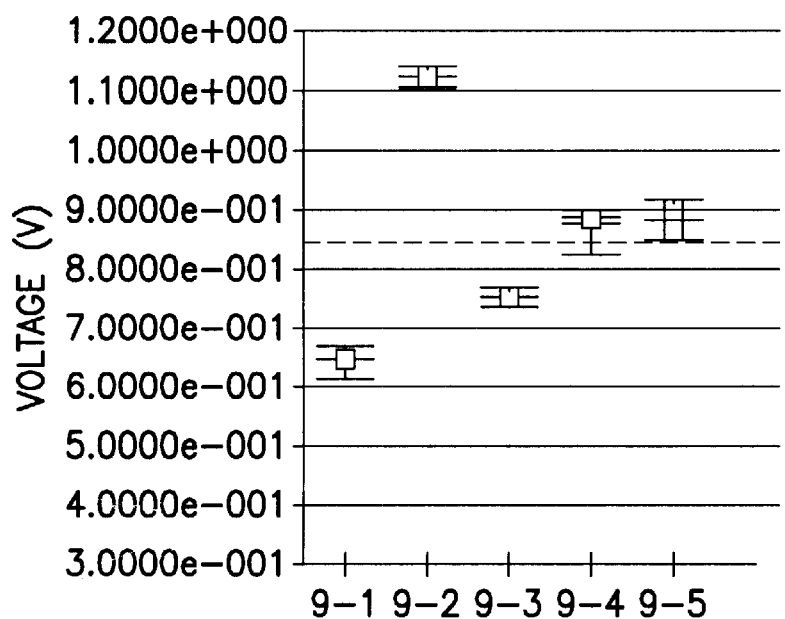

The performance parameters of devices with retrograde and standard implants are compared in FIGS. 9A and 9B. FIG. 9A shows post-irradiation (Vd=Vs=2.5 V; Vgs=0 V) leakage current (y axis, amperes, log scale) for PMOS transistors implanted under the conditions specified in the table below. FIG. 9B shows pre-irradiation threshold voltages. Each point represents measurements for 6 transistors on one wafer.

| Wafer | Ion Implanted | Dosage ($cm^{-2}$) | Energy (Kev) |
| --- | --- | --- | --- |
| 9-1 | Phosphorus | $5 \times 10^{12}$ | 35 |
| 9-2 | Phosphorus | $10^{13}$ | 35 |
| 9-3 | Arsenic | $10^{13}$ | 160 |
| 9-4 | Arsenic | $1.2 \times 10^{13}$ | 160 |
| 9-5 | Arsenic | $1.4 \times 10^{13}$ | 160 |

FIG. 9A shows, by comparing 9-1 and 9-2, that post-irradiation leakage current was improved merely by increasing the implant dosage. However, FIG. 9B. shows that merely increasing implant dosage with a standard dopant concentration profile degraded threshold voltage. The retrograde implants of increasing dosage (9-3, 9-4 and 9-5) showed improving leakage current, but also increasing threshold voltage. Thus, the optimal implant conditions will be a balance of the two effects: conditions that lead to low leakage current and low threshold voltage are desirable. In these samples, an arsenic implant of $10^{13}$ $cm^{-2}$ at 160 Kev showed a good balance of lowered leakage current and low threshold voltage.

While the invention has been described herein with reference to various illustrative features, aspects and embodiments, it will be appreciated that the invention is susceptible of variations, modifications and other embodiments, other than those specifically shown and described. The invention is therefore to be broadly interpreted and construed as including all such alternative variations, modifications and other embodiments within its spirit and scope as hereinafter claimed.

What is claimed is:

1. A silicon-on-insulator metal oxide semiconductor device which is radiation hardened, compromising:

ultrathin silicon-on-sapphire substrate; and at least one P-channel MOS transistor fabricated in the ultrathin silicon layer, wherein the ultrathin silicon layer in the P-channel region of the transistor is fully depleted and is characterized by a retograde N-type dopant concentration profile.

2. A device according to claim 1, wherein in the P-channel region the N-type dopant concentration is at least twice as high near the silicon-insulator interface as near the top of the silicon layer.

3. A device according to claim 1, wherein the N-type dopant concentration is at least ten times as high near the silicon-insulator interface as near the top of the silicon layer.

4. A device according to claim 1, wherein the N-type dopant is selected from the group consisting of phosphorus, arsenic and antimony.

5. A device according to claim 1, further comprising an N-channel MOS transistor fabricated on said ultrathin silicon-on-sapphire substrate, thereby forming a CMOS device.

6. The device of claim 1 wherein respective source and drain regions of P-channel MOS transistor extend to the silicon-sapphire interface.

* * * * *

UNITED STATES PATENT AND TRADEMARK OFFICE
CERTIFICATE OF CORRECTION

PATENT NO. : 6,531,739 B2  
DATED : March 11, 2003  
INVENTOR(S) : Cable et al.

It is certified that error appears in the above-identified patent and that said Letters Patent is hereby corrected as shown below:

Title page,
Item [56], References Cited, U.S. PATENT DOCUMENTS, please add the following references:
-- 3,882,530    5/1975 Danchenko ......357/23        09/1973
4,054,895     10/1997 Ham..............357/23       12/1976
4,591,890     05/1986 Lund et al. ......357/23.11   12/1982
4,633,289     12/1986 Yuan-Tai Chen..357/42         09/1983
4,797,721      1/1989 Hsu ..............357/23.7    04/1987
5,220,192      6/1993 Owens et al......257/519      07/1992
5,298,434      3/1994 Strater et al. .....437/21    02/1992
5,360,752     11/1994 Brady et al. ......437/62     10/1993
5,391,903      2/1995 Strater et al. .....257/351   12/1993
5,428,239      6/1995 Okumura et al...257/371       06/1993 --
OTHER PUBLICATIONS, please add the following:
-- Wolf, S., Retrograde-Well CMOS, Silicon Processing for the VLSI Era. Vol. 3: The Submicron Mosfet, Lattice Press, p. 539-555 (1995). --

Column 8,
Line 4, delete "5,416,04" and insert -- 5,416,043 --.

Column 13,
Line 12, delete "compromising" and insert -- comprising --.

Signed and Sealed this

Eleventh Day of November, 2003

JAMES E. ROGAN
*Director of the United States Patent and Trademark Office*